US008901682B2

(12) United States Patent
Reimann et al.

(10) Patent No.: US 8,901,682 B2
(45) Date of Patent: Dec. 2, 2014

(54) ACOUSTIC TRANSDUCERS WITH PERFORATED MEMBRANES

(71) Applicant: NXP B.V., Eindhoven (NL)

(72) Inventors: Klaus Reimann, Eindhoven (NL); Iris Bominaar-Silkens, Valkenswaard (NL); Twan Van Lippen, Bladel (NL); Remco Henricus Wilhelmus Pijnenburg, Hoogeloon (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/861,757

(22) Filed: Apr. 12, 2013

(65) Prior Publication Data

US 2013/0285173 A1    Oct. 31, 2013

(30) Foreign Application Priority Data

Apr. 27, 2012 (EP) .................................... 12166028

(51) Int. Cl.
| | |
|---|---|
| *H01L 29/84* | (2006.01) |
| *B81B 3/00* | (2006.01) |
| *H04R 19/00* | (2006.01) |
| *H04R 19/04* | (2006.01) |

(52) U.S. Cl.
CPC ........... *B81B 3/0072* (2013.01); *H04R 2410/03* (2013.01); *H04R 19/005* (2013.01); *H04R 19/04* (2013.01)
USPC ........................................ 257/416; 381/174

(58) Field of Classification Search
CPC .............................................. B81B 2201/0257

USPC ................... 257/416, 254, E29.324; 438/53; 381/174
See application file for complete search history.

(56) References Cited

U.S. PATENT DOCUMENTS

| | | |
|---|---|---|
| 2005/0229704 A1 | 10/2005 | Murata et al. |
| 2010/0020991 A1 * | 1/2010 | Chen .............................. 381/162 |
| 2011/0075866 A1 | 3/2011 | Zhang |
| 2012/0056282 A1 | 3/2012 | van Lippen et al. |
| 2013/0056840 A1 | 3/2013 | Bominaar-Silkens et al. |

OTHER PUBLICATIONS

Zuckerwar, A. "Theoretical Response of Condenser Microphones," J. Acoust. Soc. Am., vol. 64, No. 5, pp. 1278-1285 (1978).
Goto, M.et al. "High-Performance Condenser Microphone With Single-Crystalline Silicon Diaphragm and Backplate", IEEE Sensors J. , vol. 7, No. 1, pp. 4-10 (Jan. 2007).
Extended European Search Report for European Patent Appln. No. 12166028.6 (Jan. 21, 2013).

* cited by examiner

*Primary Examiner* — Mark Prenty (57) ABSTRACT

A MEMS device, such as a microphone, uses a perforated plate. The plate comprises an array of holes across the plate area. The plate has an area formed as a grid of polygonal cells, wherein each cell comprises a line of material following a path around the polygon thereby defining an opening in the center. In one aspect, the line of material forms a path along each side of the polygon which forms a track which extends at least once inwardly from the polygon perimeter towards the center of the polygon and back outwardly to the polygon perimeter. This defines a meandering hexagon side wall, which functions as a local spring suspension.

10 Claims, 6 Drawing Sheets

ACOUSTIC TRANSDUCERS WITH PERFORATED MEMBRANES

CROSS-REFERENCE TO RELATED APPLICATIONS

This application claims the priority under 35 U.S.C. §119 of European patent application no. 12166028.6, filed on Apr. 27, 2012, the contents of which are incorporated by reference herein.

This invention relates to acoustic transducers with perforated membranes. In particular, this invention relates to the design of perforated membranes to tolerate tensile stresses and to reduce body noise.

BACKGROUND OF THE INVENTION

Condenser microphones consist of two membranes: a membrane that is actuated by the sound pressure and a perforated membrane which forms a counter-electrode ("backplate") that does not move in response to sound pressure, as the perforations render it acoustically transparent. The perforations allow the first membrane to move without pressure build-up in the volume between membrane and backplate.

In the presence of mechanical vibrations, also known as "body noise", both plates are actuated. Due to differences in plate properties, the plates are actuated differently, so that the body noise results in relative movement of the plates. In the case of a microphone sensor, this relative movement is undesirably detected and, thus, reduces the sensor performance. In order to make the sensor intrinsically insensitive to body noise, the backplate must be designed such that it has the same response to mechanical vibrations as the membrane.

Both, sensing membrane and backplate are typically fabricated in tensile stressed layers. As the tension in the backplate might have an effect on the membrane properties or might lead to cracks, a method is needed to relax the stress in the backplate, so that the unwanted effect on the membrane is reduced.

Both stress relaxation and body-noise compensation can be achieved by attaching the backplate to elastic suspensions, such as springs. Spring-suspended (initially tensile-stressed) plates experience stress built-up at the anchors, as the plates are only attached at a limited number of sites along the plate's perimeter. This stress built-up decreases the robustness of these backplates, and means the design is sensitive to stress gradients. Also, when a spring-suspended plate is used, there is more backplate material removed near the rim of the plate than in the center. This might lead to processing problems associated with the resulting inhomogeneity of the sacrificial layer etch.

In conventional microphones with relatively large spacing between the two membranes, a few large holes in a rigid backplate are sufficient to reduce the effect of air damping. However, in miniature microphones that are built as micromechanical systems (MEMS) in Si-technology, the backplate is not rigid and should be perforated all over the plate to prevent air flow resistance, and this also enables it to be released by sacrificial layer etching.

It is noted that such perforations are also used in other moving or static MEMS-structures such as MEMS pressure sensors, MEMS electroacoustic transducers, MEMS switches, MEMS variable capacitors, or filters for gases or liquids.

Typically, a periodic pattern of square or circular holes is used, although rectangular holes have been proposed, in a more intricate pattern, for example as reported in M. Goto et al., High-performance condenser microphone with single-crystalline Si diaphragm and backplate, IEEE Sensors Journal 7, p. 4 (2007). A translational-periodic pattern of holes has the advantage that stress-gradients in the direction of the membrane normal (perpendicular to the membrane or in a vertical direction of the cross-section) do not cause a deflection of the two counter electrodes towards or away from each other. Any deflection of the backplate changes the equilibrium capacitance of the microphone.

Figure 1:
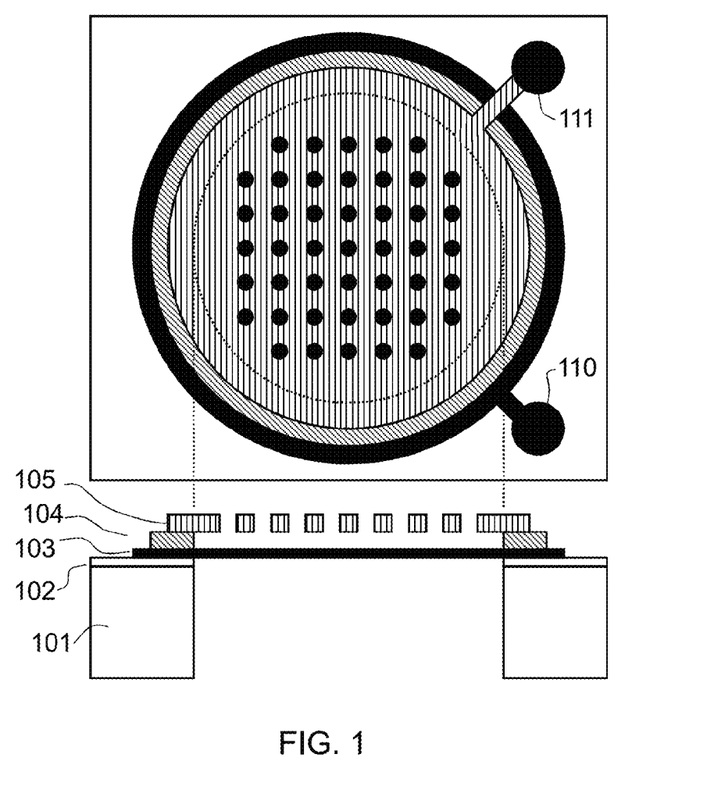
FIG. 1 shows a known microphone design.

FIG. 1 shows a top-view and cross-section through a (MEMS) condenser microphone.

The Si substrate 101 has an opening which exposes a part of the movable membrane 103 which is sensitive to acoustic pressure. The movable membrane is formed over an (optional) insulator 102. The backplate 105 (a fixed membrane) is suspended over a further insulator 104 and is perforated with a regular pattern of holes. The electrode connections 110,111 are to the two membranes and are used to measure the capacitance.

An issue in the fabrication of MEMS devices is that the stress and the stress gradient are difficult to control in processing.

One way to influence the stress is by altering the shapes and orientations of the perforations, and thereby varying the perforation degree. However, the resonance frequency is also lowered if the mass of membrane is decreased (by increasing the overall area of the perforations). If frequency matching is desired, this phenomena can be a sizable obstacle. At very high perforation degrees, manufacturing becomes difficult, the perforated membrane becomes fragile, and the capacitance and signal strength decrease. Typically, the smallest dimension for the hole diameter is 0.25-0.5 µm and 10-20 µm width between two openings.

Another problem is that of the mechanical toughness of perforated membranes. The holes lead to stress concentration around the edges which give rise to easier crack formation. Rounded edges are beneficial, but a circular shape is not the optimum in terms of electro-mechanical signal and noise generation.

This invention is based on a design to provide improved stress relaxation and/or improved mechanical toughness without the drawbacks discussed above.

US 2005/0229704 discloses an accelerometer with in-plane movement of a membrane. The membrane has openings to facilitate an etch release, for example a regular array of hexagonal openings.

US2011/075866 discloses a microphone with a backplate having an array of openings.

SUMMARY OF THE INVENTION

The invention is defined by the independent claims.

According to a first aspect of the invention, there is provided a MEMS device comprising at least one membrane, wherein the at least one membrane has an area including a grid of convex polygonal cells, wherein each cell comprises a line of material following a path around the polygon thereby defining an opening in the centre of the polygon, wherein the line of material forms a path along each side of the polygon which forms a track which extends at least once inwardly from the polygon perimeter towards the centre of the polygon and back outwardly to the polygon perimeter, wherein the polygon comprises a triangle, pentagon or hexagon.

Instead of forming a circular (or other shape) opening in the centre of a grid, a grid is formed using lines of material. These lines can be of constant width. The shape of the track defines at least one undulation along each polygon side, and each side functions as a local spring element.

The polygon preferably comprises a triangle, pentagon or hexagon. These enable an isotropic stiffness and stress distribution. An isotropic mechanical response is advantageous to achieve a high degree of symmetry and is hence less susceptible for specific manufacturing shortcomings or the excitation of unwanted mechanical resonances. Also a uniform stress at the anchors is more easily achieved. The mechanical stiffness is a tensor of fourth rank. This means that a four-fold symmetry as of a square grid is not sufficient to ensure an isotropic in-plane stiffness. The uniaxial stiffness in 45, 135, 225, 315 degree is still generally different from the stiffness in 0, 90, 180, 270 degree. This can be easily seen from the example of a square where each side is a spring. The stiffness is high when the stress is applied along the spring directions (0, 90, ... degree). In 45 degree, the springs are not extended, but just bended which is leads to a much lower stiffness along these directions. 3-fold, 5-fold, 6-fold, ... or isotropic rotational symmetry of the tiling (not necessarily of the single polygon) leads to isotropic in-plane stiffness.

In a particularly preferred example, the polygon comprises a hexagon, which means the same design of cell can be used throughout the area.

In one design, each unit cell comprises a closed path around the hexagon, with indents at the hexagon corners towards the hexagon centre. These indents mean that the corners are strengthened (because the indents for the three corners where three adjacent hexagons meet, together form a closed shape). The central part of each hexagon side thus defines the spring element part of the design.

In another design, each side of the hexagon comprises a line between the corners, which extends inwardly once towards the centre of the hexagon and outwardly once towards the centre of an adjacent hexagon. This line thus meanders across the hexagon side, and defines a spring structure. A single line is shared between adjacent hexagon sides. The line shape can be rotationally 180 degrees symmetric.

In another design. each side of the hexagon comprises a line between the corners, which extends inwardly twice towards the centre of the hexagon and outwardly twice towards the centre of an adjacent hexagon. This defines a double meander, and gives increased flexibility to the spring function. Each side of the hexagon can again be rotationally 180 degrees symmetric.

According to a second aspect of the invention, there is provided a MEMS device comprising at least one membrane, wherein the membrane has an area including a grid of convex polygonal cells, wherein each cell comprises a line of material following a path around the polygon thereby defining an opening in the centre of the polygon, wherein the line of material has a non-uniform width with a larger width in the centre of the polygon side than at the ends of the polygon side.

This defines a large opening (because the line width is narrow at the polygon corner), but the non-uniform width enables a meandering shape of the inner edge of the polygon. This improves the mechanical strength and resistance to cracking, and also provides a spring function (mainly dependent on the narrow regions).

Again, the polygon can comprise a triangle, pentagon or hexagon. When a hexagon is used, this means the same cells can be used throughout the area.

In one example, each unit cell comprises a hexagon with rounded indents at the inside edge of each corner. These indents reduce the risk of cracking at sharp hexagon corners. Each unit cell can comprise a hexagon with an undulating inner shape.

Typically, the device comprises a fixed membrane and a movable membrane separated by a gap, and the movement of the movable membrane is sensed or controlled to provide the operation of the device.

The invention can for example be applied to a microphone.

The fixed membrane is preferably clamped along its full perimeter. The stress built-up is thus not concentrated at a limited number of anchors, as is the case for suspension by springs. Hence, the robustness is increased. Thus, the design provides body noise suppression in the same way as the use of spring anchors, but avoids the stress build up at discrete anchors.

BRIEF DESCRIPTION OF THE DRAWINGS

Examples of the invention will now be described with reference to the accompanying drawings, in which.

DETAILED DESCRIPTION OF THE EMBODIMENTS

The invention provides a MEMS device such as a microphone, which uses a fixed perforated plate. The fixed plate has an area formed as a polygonal grid of unit cells, wherein each unit cell comprises a line of material following a path around the polygon thereby defining an opening in the centre of the polygon. The fixed plate area may be the full area of the fixed membrane.

In one aspect, the line of material forms a path along each side of a polygon which forms a track which extends at least once inwardly from the polygon perimeter towards the centre of the polygon and back outwardly to the polygon perimeter. This defines a meandering hexagon side wall, which functions as a local spring suspension.

In another aspect, the line of material has a non-uniform width with a wider width in the centre of the polygon side that at the ends of the polygon side. This defines a large opening (because the line width is narrow at the corner), but the non-uniform width enables a meandering shape of the inner edge of the polygon. This improves the mechanical strength and resistance to cracking.

As outlined above, perforation patterns in elastic plates in MEMS devices are typically used to reduce air damping and/or to allow removal of a sacrificial layer during the fabrication process. For these applications, periodic patterns of circular or square holes are typically used. Commonly, the periodic patterns are such that the area is divided into unit cells, each containing one hole, as illustrated in FIG. 2.

Figure 2:
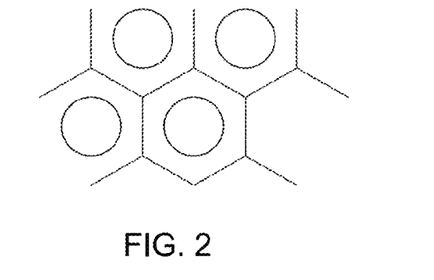
FIG. 2 shows a known perforation design for the microphone backplate.

The hexagonal symmetry shown in FIG. 2 has the advantage over a square symmetry that it is more isotropic against stresses from all directions. However, this pattern is also fairly rigid. It allows only limited stress relaxation.

A first aspect of the invention is based on the use of microspring patterns that replace the connection lines of the hexagonal (or other polygonal) pattern by softer constructions. One problem is that the full area must be filled and that it can be manufactured. This means that the spacing between remaining membrane material must be large enough for lithography (>0.5 μm typically) and the widths of remaining sections small enough to be released during the sacrificial layer etching (typically <10 μm).

Figure 3:
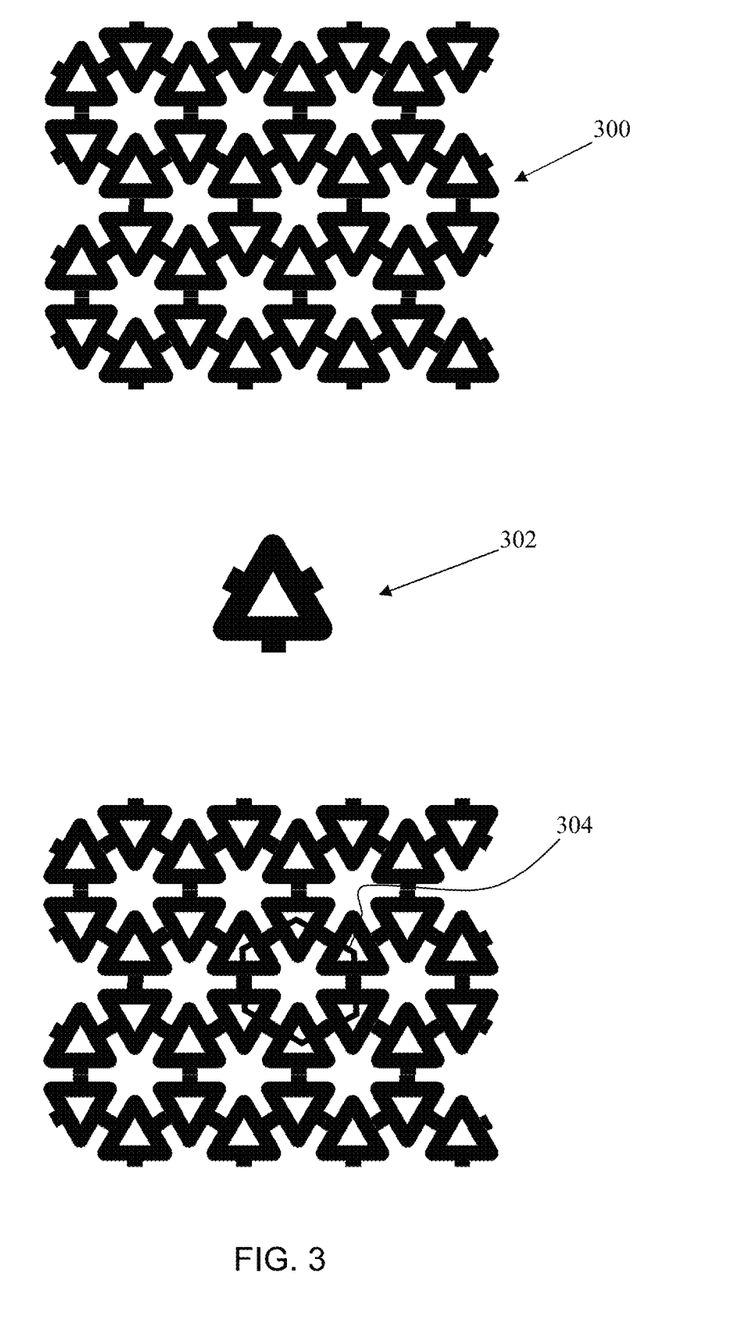
FIG. 3 shows a first example of perforation design of the invention.

FIG. 3 shows a first example of pattern of the invention for the fixed membrane 105.

The area is formed as a hexagonal grid of unit cells, wherein each unit cell comprises a line of material following a path around the hexagon thereby defining an opening in the centre of the hexagon.

The top image shows the pattern 300. The middle image shows the smallest unit 302 which is repeated to form the pattern, and the bottom image shows how the pattern is a repeating hexagonal base unit 304. The hexagonal base unit is not the smallest repeating unit of the design.

The line of material forms a path along each side of the hexagon which forms a track which extends at least once inwardly from the hexagon perimeter towards the centre of the hexagon and back outwardly to the hexagon perimeter.

In the design of FIG. 3, the side of the hexagon 304 has a central part along the hexagon side, and indents at the hexagon corners towards the hexagon centre. Three of these indents for the three meeting corners in the pattern together form the unit cell 302. The indents extend approximately half way towards the hexagon centre from the corner, for example between 35% and 65% of the way towards the centre.

The central part of the hexagon side defines the soft part of the spring structure and the unit cell triangles in the corners define more rigid parts. The design has lower stiffness than a regular hexagonal grid.

The line forming the pattern has constant width, chosen to enable practical manufacture, and the size of the hexagons is chosen to give the desired perforation hole size. Thus, the springs are constructed such that they fill the full area for maximum electrical signal and fulfil the needs for sacrificial layer etching.

By way of example, the line width may be less than 10 μm, and more generally in the range 0.5 μm to 10 μm, and the face to face dimension of the hexagon may be in the range 50 μm to 1 mm.

Figure 4:
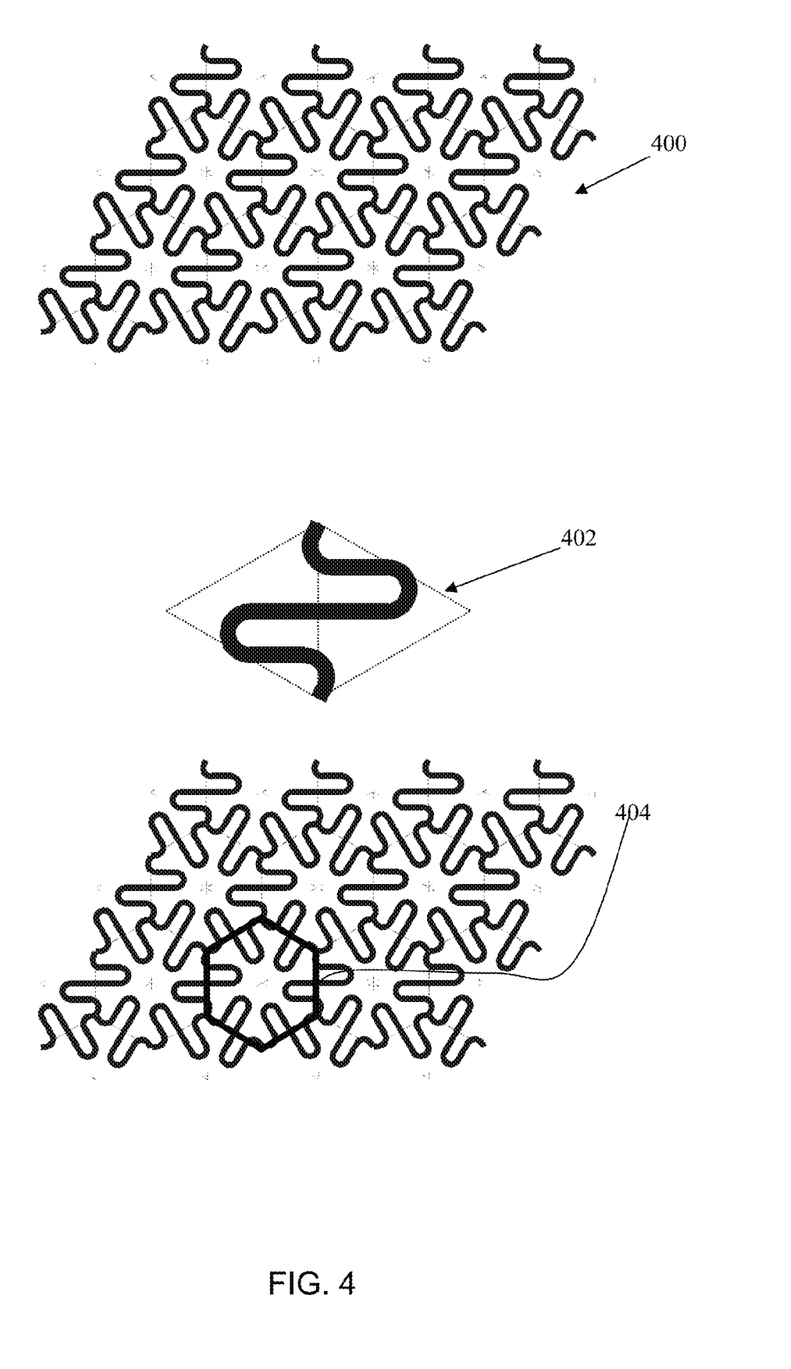
FIG. 4 shows a second example of perforation design of the invention.

FIG. 4 shows a second example of pattern 400 in the form of a meandering spring.

Each side of the hexagon comprises a line between the corners, which extends inwardly once towards the centre of the hexagon and outwardly once towards the centre of an adjacent hexagon. The smallest repeating unit 402 in this case is one of the hexagon sides, within a rhombus area. This is rotationally symmetric. The pattern also repeats in larger hexagonal unit cells 404.

At the corners, there is also curvature, so it could be considered that there are four rather than two undulations in total.

Figure 5:
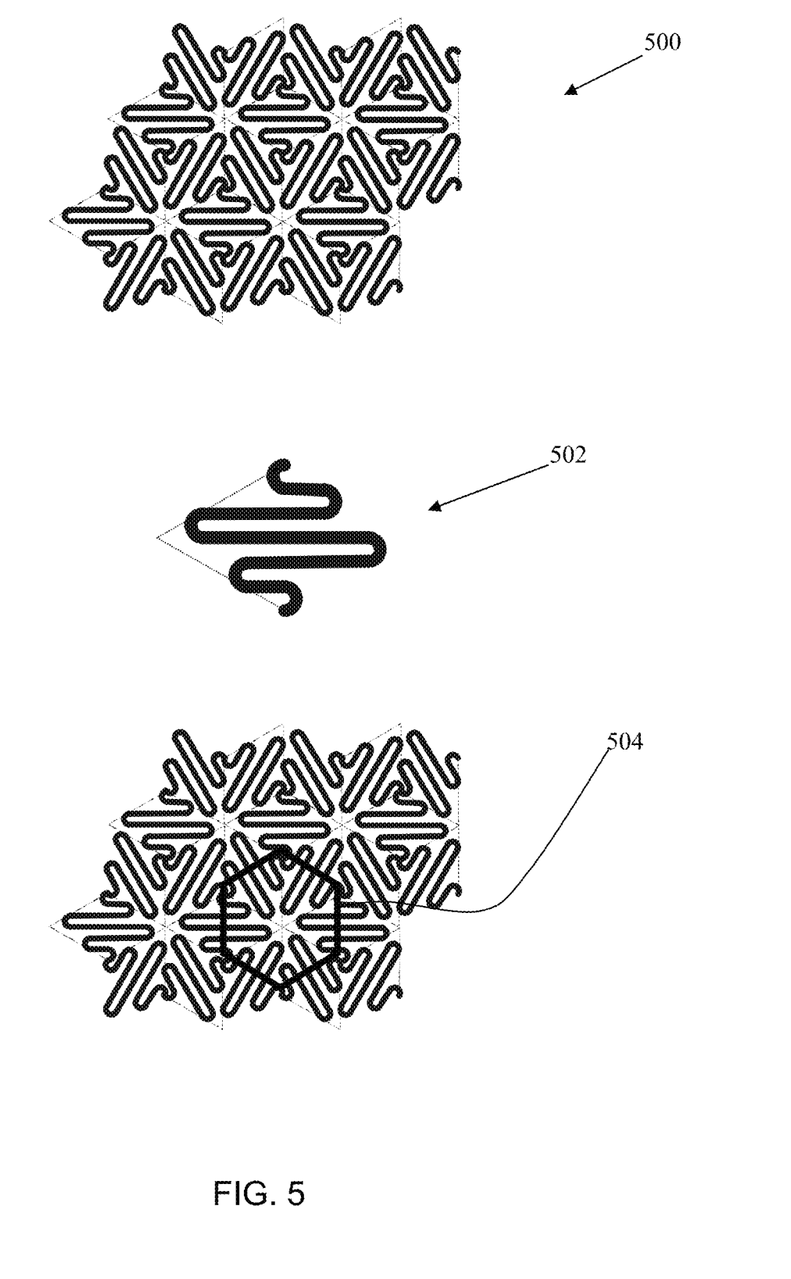
FIG. 5 shows a third example of perforation design of the invention.

FIG. 5 shows a second example of pattern 500 in the form of a meandering spring.

Each side of the hexagon comprises a line between the corners, which extends inwardly twice towards the centre of the hexagon and outwardly twice towards the centre of an adjacent hexagon. The smallest repeating unit 502 in this case is again one of the hexagon sides, within a rhombus area. This is again rotationally symmetric. The pattern also repeats in larger hexagonal unit cells 504.

The hexagonal unit cells can be defined as the smallest repeating hexagons (as there are larger patterns of multiple hexagons which also repeat).

At the corners, there is also again curvature, so it could be considered that there are six rather than four undulations in total.

This design gives even greater flexibility. The concept can be extended to provide further undulations on each hexagon side.

These designs provide improved resistance to stress. Another issue is mechanical strength.

Circular holes as in FIG. 2 are generally quite robust. However, in a microphone, the air has to be squeezed out below the perforated membrane. This air flow distance through the air gap is larger than for hexagonal holes (such as 600 in FIG. 6), but the sharp corners ease crack formation.

Figure 6:
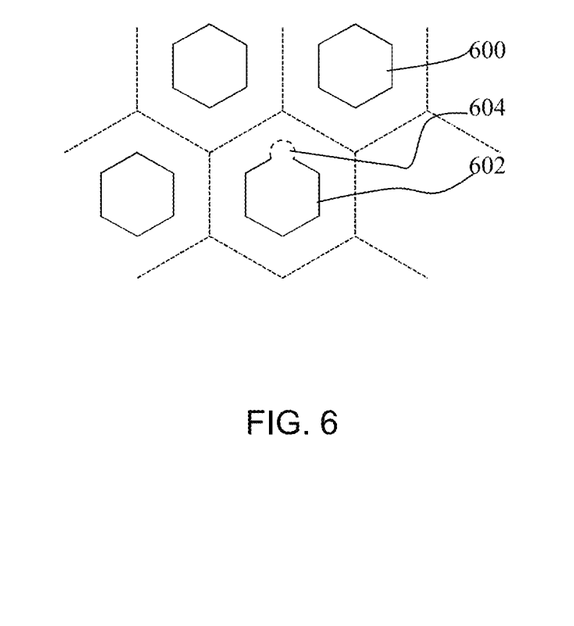
FIG. 6 shows a fourth example of perforation design of the invention.

FIG. 6 shows a design based on hexagonal perforation holes, and shows one hole 602 with a modified design incorporating a stress-relief hole 604 around one corner. To implement this concept, all corners of all hexagons will be provided with the stress relief holes, but only one is shown in FIG. 6.

The result is that the line of material forming the hexagonal grid has a non-uniform width with a larger width in the centre of the hexagon side than at the ends of the hexagon side (i.e. at the corners).

The holes will influence the electrical performance of the microphone. An optimum trade-off must therefore be found.

Figure 7:
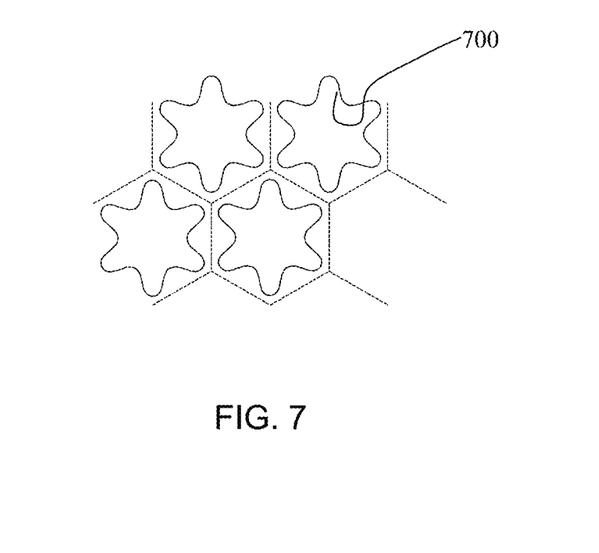
FIG. 7 shows a fifth example of perforation design of the invention.

In FIG. 7, the hole shape is defined as a superposition of cylindrical harmonics that are compatible with the grid symmetry, e.g., the hole radius as function of the angle is given by $$r(\varphi) = \sum_n r_n \cos(n\varphi).$$

Only a few orders n are taken and only a few coefficients $r_n$ must be optimized.

FIG. 7 shows a possible hole shape 700 up to the first order. It is exaggerated. In reality, the shape looks almost circular for small perforation degrees. For larger perforation degrees, the shape may have concave parts as shown in FIG. 7, depending on the gap and membrane thickness and the pitch.

The optimization can be done in several steps:
1. Specify the needed air flow resistance;
2. Set the pitch;
3. Optimize the pattern; and
4. Vary the pitch and optimize for sensitivity.

Of course, also a parameter space could be simulated and the optimum taken. Or other optimization strategies can be followed.

The invention can be used in body-noise compensated microphones, or mechanically optimized membranes.

As is clear from the above, the invention is of particular interest for microphones. However, it can be applied to other types of device, such as MEMS switches, MEMS varicaps, MEMS acoustic transducers, microvalves, or microfilters. The invention applies the plate pattern to the fixed membrane, and the holes of the pattern can be those used for sacrificial etch release. It should be clear that the invention can also be applied to movable membranes to optimize the fracture toughness or to tune the mechanical properties, e.g., for body-noise compensation or sensing of mechanical quantities.

FIG. 1 shows a microphone with the pressure-sensitive membrane at the bottom, but the invention can equally be applied to microphones where the pressure sensitive membrane is above the insensitive membrane.

The pressure-insensitive membrane is typically formed of silicon, but other materials may be used, such as Al or Au or multilayers of SiNx, SiOxNy, SiC or SiO2 and conductors such as Si, Al, Ti, W, TiN, TiW, Au, ITO, Pt.

The invention is implemented as a change in the hole pattern, but this does not require any change to the known deposition and patterning processes used to form the device, and for this reason, the method of manufacturing the device has not been described in detail.

The hexagonal pattern may be applied to all of the fixed membrane, but this is not essential. For example the central region may have the pattern of the invention, and a peripheral area may have a regular pattern of circular or polygonal openings.

As explained above, the design may be chosen to provide stress relaxation to avoid cracks, and to provide body noise compensation (i.e. insensitivity to acceleration), and/or to improve mechanical robustness against dropping. The easiest way to design the membrane to achieve the desired goal or goals is to use finite element simulations, although analytical calculations are also possible. The finite element simulator needs the material parameters, stress and stress gradient as input parameters for the simulations.

In all examples above, the pattern is based on a hexagonal grid, and this can in turn be formed from identical diamond shaped tiles or unit cells (as shown in FIG. 5). This of course means that an area can be tiled using a set of identical regular hexagonal cells. However, the way the invention makes use of a line of material can be extended to other polygons. Many polygons cannot be tiled together with a single design of cell, so there may be multiple cell shapes.

Figure 8:
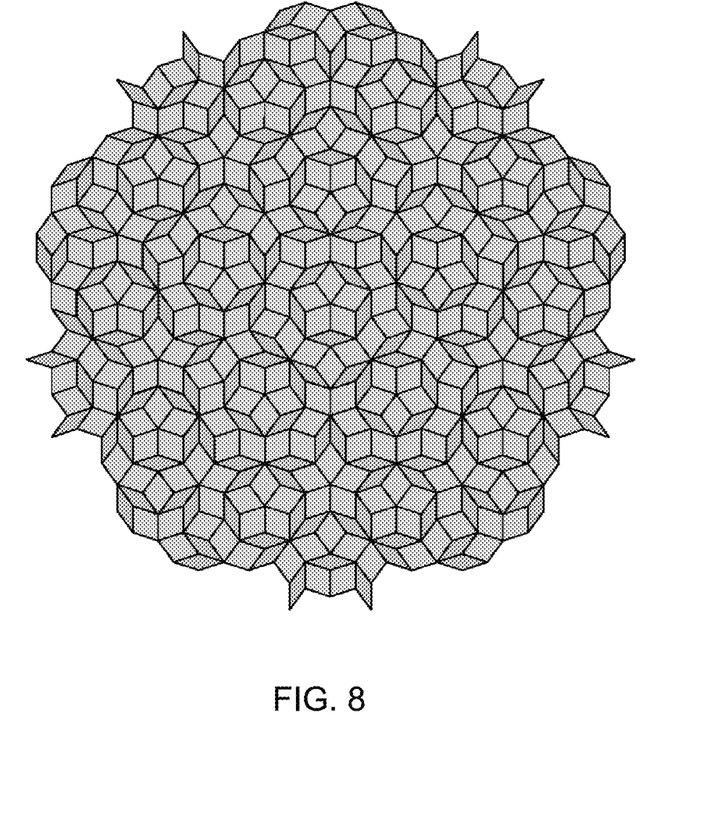
FIG. 8 shows an alternative possible unit cell tile design.

FIG. 8 shows a quasi-crystalline pattern using two types of rhombus as the smallest unit cell—Two slightly different rhombus designs such as 502 in FIG. 5 can be tiled to create the pattern of FIG. 8. Within the pattern, there are many pentagonal clusters of the basic unit cells, which define polygons (pentagons) with a path of material around the pentagon with the same effects and advantages as the hexagonal cells above. Thus, the "cells" in this case are the pentagonal clusters of "sub-cells", and the sub-cells are the basic unit cell of the tiled design. The basic unit cells making up the polygonal shapes are again rhombus (diamond) shapes.

Thus, the invention can be seen as an arrangement of polygons (the hexagons or pentagons) having a track around the polygon shape, or else it may be seen as a fully tiled arrangement of unit cells, which comprise rhombus unit cells. There may be one or more basic rhombus unit cell designs to enable different tiled patterns to be formed.

It will be apparent from FIG. 8 that some tiling designs do not allow the polygon shapes to fully occupy the area, and they are spaced by other arrangements of the basic unit cells.

Thus, the term "a grid of convex polygonal cells" requires a pattern of lines to form a set of closed convex polygons. These polygons may define the full area so that the grid comprises only those polygons (like the hexagonal tessellations of FIGS. 3 to 7) or they may be interspersed with other patterns so that a more complicated grid pattern is formed (like FIG. 8).

If the polygons are hexagons, it may be possible to define smaller closed shapes within each hexagon. For example, each hexagon may have a line from alternate corners to the centre (dividing the hexagon into three rhombus shapes). However, the hexagonal nature of the pattern provides the desired isotropy and 6-fold symmetry.

The invention is of particular interest for designs which ensure an isotropic mechanical compliance. This is the case for a hexagonal grid. In a square grid with 4-fold symmetry or a rectangular grid with 2-fold symmetry, an isotropic mechanical compliance is not ensured. For this reason preferred examples of the invention relate specifically to grids with 3-fold, 6-fold or 5-fold (quasicrystalline) symmetry, which can ensure the desired isotropic symmetry. These designs thus enable different stress patterns in production to be tolerated, for example to tolerate patterns where a feature near the membrane can break the symmetry of the stress pattern.

In the case of a hexagon, a single identical regular hexagon can be used to tessellate the full area. Generally, and in the case of a symmetric pattern, the full area is formed with convex polygons, and they may all be the same or else they may include different polygon types. Indeed, combinations of polygons can be tessellated. For example, regular hexagons and triangles can be tessellated to form a pattern with 6-fold symmetry. Preferably a polygon or combination of polygons is used which avoids 4-fold symmetry.

In a set of quasi-symmetric examples, such as FIG. 8, the pattern is more complex and includes open areas in addition to the polygons, rather than only a set of closed polygons.

In some aspects, the invention thus aims to provide, on average, an isotropic stress pattern (specifically an isotropic compliance tensor).

Various modifications will be apparent to those skilled in the art.

The invention claimed is:

1. A MEMS device comprising at least one membrane, wherein the at least one membrane has an area including a grid of convex polygonal cells, wherein each cell comprises a line of material of constant width following a path around the polygon thereby defining an opening in the centre of the polygon,
wherein the line of material forms a path along each side of the polygon which forms a track which, for each corner of the polygon, extends at least once inwardly from the polygon perimeter towards the centre of the polygon and back outwardly to the polygon perimeter, wherein the polygon comprises one of a triangle, a pentagon and a hexagon.

2. A device as claimed in claim 1, wherein the polygon comprises the hexagon.

3. A device as claimed in claim 2, wherein each cell comprises a closed path around the hexagon, with indents at the hexagon corners towards the hexagon centre.

4. A device as claimed in claim 2, wherein each side of the hexagon comprises a line between the corners, which extends inwardly once towards the centre of the hexagon and outwardly once towards the centre of an adjacent hexagon.

5. A device as claimed in claim 4, wherein each side of the hexagon is rotationally 180 degrees symmetric.

6. A device as claimed in claim 4, wherein each side of the hexagon comprises a line between the corners, which extends inwardly twice towards the centre of the hexagon and outwardly twice towards the centre of an adjacent hexagon.

7. A device as claimed in claim 6, wherein each side of the hexagon is rotationally 180 degrees symmetric.

8. A device as in claim 1, comprising a microphone.

9. A device as in claim 1, wherein the membrane is clamped along its full perimeter.

10. A device as in claim 1, wherein the at least one membrane comprises a fixed membrane and a movable membrane separated by a gap, and the movement of the movable membrane is at least one of sensed and controlled to provide the operation of the device.

* * * * *